(12) United States Patent
Furue et al.

(10) Patent No.: US 6,962,827 B1
(45) Date of Patent: Nov. 8, 2005

(54) SEMICONDUCTOR DEVICE CAPABLE OF SHORTENING TEST TIME AND SUPPRESSING INCREASE IN CHIP AREA, AND METHOD OF MANUFACTURING SEMICONDUCTOR INTEGRATED CIRCUIT DEVICE

(75) Inventors: Katsuya Furue, Hyogo (JP); Shigeru Kikuda, Hyogo (JP); Kiyohiro Furutani, Hyogo (JP); Tetsushi Tanizaki, Hyogo (JP); Shigehiro Kuge, Hyogo (JP); Takashi Kono, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 231 days.

(21) Appl. No.: 10/640,322

(22) Filed: Aug. 14, 2003

Related U.S. Application Data

(62) Division of application No. 09/521,671, filed on Mar. 8, 2000, now abandoned.

(30) Foreign Application Priority Data

Sep. 10, 1999 (JP) .............................. 11-257353

(51) Int. Cl.$^7$ ........................................... H01L 21/66
(52) U.S. Cl. ...................................................... 438/14
(58) Field of Search .............................. 438/2, 5, 6, 10, 438/11, 14, 17, 18, 23, 107, 110, 113, 128–130, 438/403–405, 458, 460, 462, 598, 599, 975

(56) References Cited

U.S. PATENT DOCUMENTS

| | | | | |
|---|---|---|---|---|
| 5,389,556 A | * | 2/1995 | Rostoker et al. | 438/17 |
| 5,391,501 A | * | 2/1995 | Usami et al. | 438/12 |
| 5,648,661 A | | 7/1997 | Rostoker et al. | |
| 5,654,588 A | | 8/1997 | Dasse et al. | |
| 5,825,193 A | | 10/1998 | Nakata et al. | |
| 6,001,662 A | * | 12/1999 | Correale et al. | 438/11 |
| 2004/0266036 A1 | * | 12/2004 | Cram | 438/14 |

FOREIGN PATENT DOCUMENTS

JP      4-152543      5/1992

* cited by examiner

Primary Examiner—Ha Nguyen
Assistant Examiner—Andre' Stevenson
(74) Attorney, Agent, or Firm—McDermott Will & Emery LLP

(57) ABSTRACT

A plurality of semiconductor integrated circuits and a plurality of TEG circuits are aligned and provided on a substrate. In the TEG circuit, a built-in test circuit is provided in a region which faces a semiconductor integrated circuit across a dicing line region. The built-in test circuit and the semiconductor integrated circuit are connected by an interconnection which is provided on the dicing line region. The interconnection is cut for isolation into chips.

10 Claims, 13 Drawing Sheets

SEMICONDUCTOR DEVICE CAPABLE OF SHORTENING TEST TIME AND SUPPRESSING INCREASE IN CHIP AREA, AND METHOD OF MANUFACTURING SEMICONDUCTOR INTEGRATED CIRCUIT DEVICE

This application is a divisional of application Ser. No. 09/521,671 filed Mar. 8, 2000 now abandoned.

BACKGROUND OF THE INVENTION

1. Field of the Invention

The present invention relates to semiconductor devices for collectively forming a plurality of semiconductor integrated circuits, and methods of manufacturing a semiconductor integrated circuit device. More particularly, the present invention relates to a semiconductor device for collectively forming a plurality of semiconductor integrated circuits by providing a self test circuit capable of generating a test signal by itself and testing the operation of a semiconductor integrated circuit, and a method of manufacturing a semiconductor integrated circuit device.

2. Description of the Background Art

As semiconductor integrated circuits, for example, semiconductor memories such as dynamic random access type memories (hereinafter, referred to as DRAMs) are highly integrated, increase in the time for testing the circuit operation and the load applied to testers is accelerated. The increased test time directly raises the manufacturing cost of a semiconductor integrated circuit.

For example, the functions of a semiconductor memory chip are often tested by a large tester after completion of the wafer process or at the shipment stage after packaging. The function test in this case is strictly performed by designating conditions such as a power supply voltage, an ambient temperature, an input signal timing, an operation mode, a data input, and an address.

The test time increases in proportion to the memory capacity even in a simple writing/reading cycle. If the test is to be performed by a large tester, this may raise the chip cost.

Therefore, a test circuit has been provided inside a chip. Instead of supplying a test signal from a tester to each chip, a test signal generated by the built-in test circuit itself is supplied to the internal circuitry of each chip. According to a signal which is output from the internal circuitry, the built-in test circuit itself determines whether the internal circuitry functions well, and externally outputs the determination result. Such an arrangement can substantially reduce tester loads.

However, provision of the test circuit in each semiconductor integrated circuit chip increases the area of each chip and reduces the number of chips which can be manufactured per wafer.

As each semiconductor integrated circuit has higher performance, however, it is desired that a test circuit and an integrated circuit to be tested are closely provided on one substrate to improve the transfer rate of data which is transmitted between the test circuit and the integrated circuit.

In stead of providing a built-in test circuit for each chip, test circuits are provided in chips which are close to a plurality of integrated circuit chips formed on a wafer to test the integrated circuit chips on the same wafer. FIG. 17 shows an integrated circuit assembly having such a construction disclosed in Japanese Patent Laying-Open No. 4-152543.

Referring to FIG. 17, the conventional integrated circuit assembly having a self test function includes an integrated circuit 31 to be tested, and a self test circuit 32 which extracts test data by experimentally operating the integrated circuit. They are on the same substrate and provided side by side in first and second regions 21 and 22 which can be divided by a chip division line 23.

A semiconductor integrated circuit manufacturing process generally employs an exposure device called a stepper. The stepper has a limit in the size of an area which is exposed by one shot of the stepper. For example, the area exposed by one shot includes, in addition to the pattern of a semiconductor integrated circuit to be manufactured, a TEG (Test Elements Group) pattern for the in-line test which monitors the process, and so on. In this case, the area also has a test circuit (self test circuit) pattern. When the process is matured and transferring of the test circuit is to be eliminated, however, mask revision is necessary and it is ineffective.

SUMMARY OF THE INVENTION

An object of the present invention is to provide a semiconductor device which allows a test to be performed in a short time period and suppression of the increase in the chip area of a semiconductor integrated circuit when collectively manufacturing a plurality of semiconductor integrated circuits even if the semiconductor integrated circuits are highly integrated, and a method of manufacturing a semiconductor integrated circuit device.

In summary, the present invention provides a semiconductor device including a substrate, a plurality of semiconductor integrated circuits, a plurality of first test circuit formation regions, and an isolation margin region.

The plurality of semiconductor integrated circuits are collectively formed on a main surface of the substrate. The plurality of first test circuits formation regions are provided on the main surface of the substrate correspondingly to the semiconductor integrated circuits.

The isolation margin region is provided on the substrate to be able to isolate the plurality of semiconductor integrated circuits and the plurality of first test circuit formation regions from each other.

The first test circuit formation regions each include a plurality of first test elements to perform an in-line test for the manufacturing process of semiconductor integrated circuits, and a first self operational test circuit to generate and supply a test signal to a corresponding semiconductor integrated circuit, and determine, according to an output signal from the corresponding semiconductor integrated circuit, whether the corresponding semiconductor integrated circuit operates well.

The first self operational test circuit is provided in such a region of the first test circuit formation region that faces an adjacent semiconductor integrated circuit across the isolation margin region.

According to another aspect of the present invention, a method of manufacturing a semiconductor integrated circuit device includes the steps of collectively forming a plurality of semiconductor integrated circuits on a main surface of a substrate, and forming a plurality of first test circuit formation regions provided correspondingly to the semiconductor integrated circuits, simultaneously with formation of the plurality of semiconductor integrated circuits, while providing an isolation margin region to be able to isolate the plurality of semiconductor integrated circuits and the plurality of first test circuit formation regions from each other.

The step of forming the first test circuit formation regions includes the step of forming a first self operational test circuit in such a region of the first test circuit formation region that faces an adjacent semiconductor integrated circuit across the isolation margin region.

The method of manufacturing a semiconductor integrated circuit device further includes the steps of performing an in-line test for the manufacturing process of the semiconductor integrated circuit by using a plurality of first test elements included in each of the first test circuit formation regions, generating and supplying a test signal to a corresponding semiconductor integrated circuit and determining, according to an output signal from the corresponding semiconductor integrated circuit, whether the corresponding semiconductor integrated circuit operates well by using the first self operational test circuit included in each of the first test circuit formation regions, and isolating the plurality of semiconductor integrated circuits into chips by cutting the isolation margin region.

Therefore, a main advantage of the present invention is that a test can be performed in a short time period and the increase in the chip area of a semiconductor integrated circuit can be suppressed even when the semiconductor integrated circuit is highly integrated.

Another advantage of the present invention is that a test can be performed in a short time period and the increase in the chip area of the semiconductor integrated circuit can be suppressed during collective manufacturing of a plurality of semiconductor integrated circuits even when the semiconductor integrated circuits are highly integrated.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
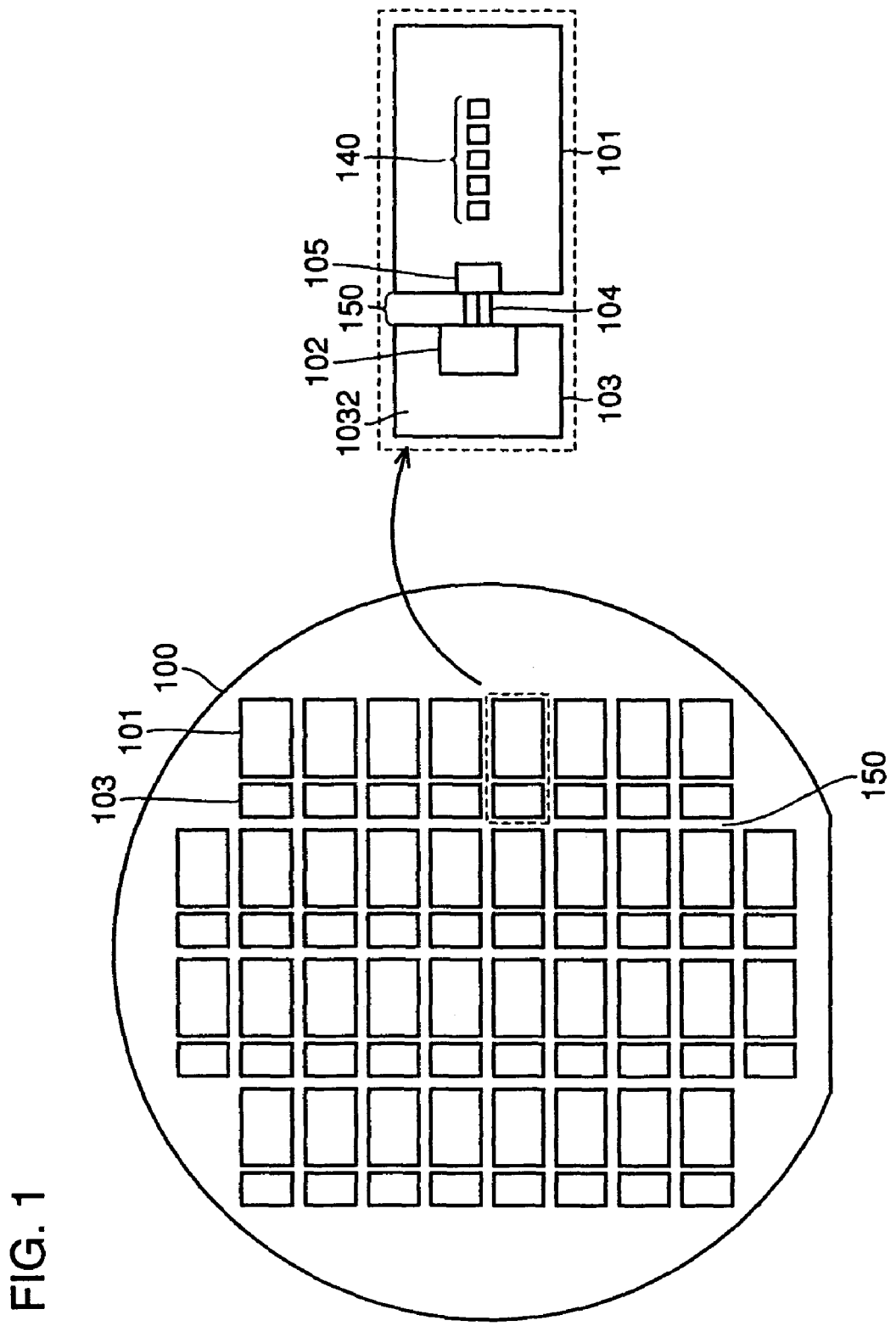
FIG. 1 is a schematic block diagram showing a structure of a semiconductor substrate 100 for forming a semiconductor integrated circuit 101 in a first embodiment of the present invention.

FIG. 1 is a schematic block diagram showing a structure of a semiconductor substrate 100 for forming a semiconductor integrated circuit 101 in a first embodiment of the present invention.

Semiconductor substrate 100 includes a plurality of semiconductor integrated circuits 101 to be tested and a plurality of TEG circuits 103. Semiconductor integrated circuits 101 and TEG circuits 103 are aligned. The plurality of semiconductor integrated circuits 101 and TEG circuits 103 are isolated from each other by a dicing line region 150 so that they can be isolated such as by dicing.

TEG circuit 103 includes a test element region 1032 which has circuit elements such as a resistance element, a transistor element, and a capacitor for monitoring the process state, and a built-in test circuit 102.

Built-in test circuit 102 supplies the internal circuitry of each chip with a test signal generated by itself, determines whether the internal circuitry functions well according to an output signal from the internal circuitry, and externally outputs the determination result.

In order to transmit data and power supply potentials between built-in test circuit 102 and semiconductor integrated circuit 101 to be tested, an interconnection 104 connects built-in test circuit 102 and semiconductor integrated circuit 101 via dicing line region 150.

Although it is not always the case, interconnection 104 can be an aluminum interconnection.

Semiconductor integrated circuit 101 includes an input/output circuit 105 for transmitting data and power supply potentials to and from built-in test circuit 102 via interconnection 104, and pads 140 for transmitting data, power supply potentials, and ground potentials to and from an external unit.

A test result of built-in test circuit 102 may be output to an external unit (tester device) via a pad which is provided in the built-in test circuit correspondingly to built-in test circuit 102, or output to an external unit (tester device) via pad 140 of semiconductor integrated circuit 101.

As described above, built-in test circuit 102 is provided in TEG circuit 103 which is provided adjacent to semiconductor integrated circuit 101 to be tested, which makes it possible to suppress increase in the chip area of semiconductor integrated circuit 101.

Since built-in test circuit 102 is provided adjacent to input/output circuit 105 of semiconductor integrated circuit 101, the length of interconnection 104 can be shortened and the influences of interconnection resistance and parasitic capacitance of interconnection 104 can be minimized. Thus, a test can be performed at high speed.

Any substrates on which main surface semiconductor integrated circuits can be formed may be used for semiconductor substrate 100. For example, a conventional silicon (Si) substrate or an SOI (Semiconductor on Insulator) substrate can be suitably employed.

Figure 2:
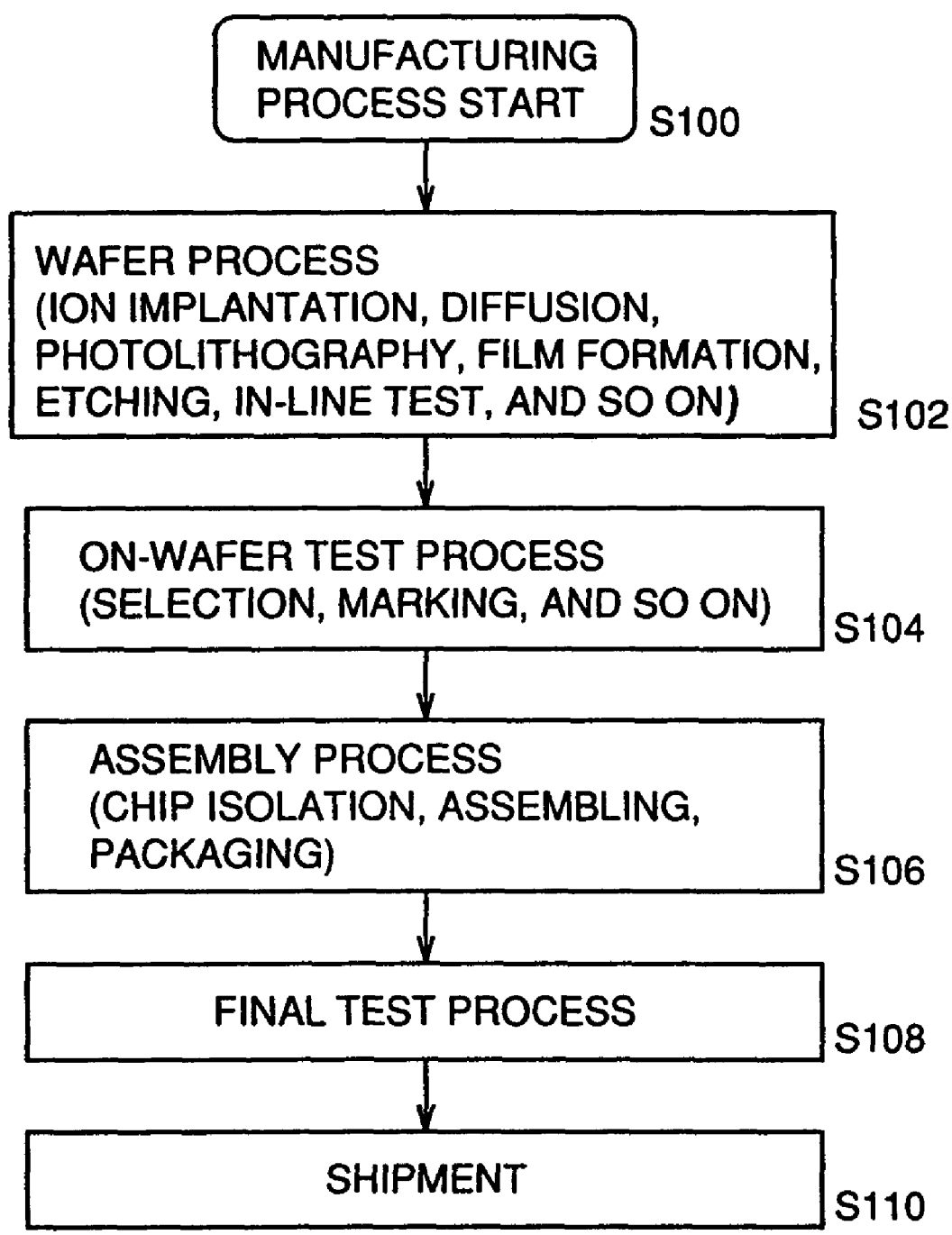
FIG. 2 is a flow chart for describing a process of manufacturing a semiconductor integrated circuit device which contains a semiconductor integrated circuit 101 to be tested.

FIG. 2 is a flow chart for describing a process of manufacturing substrate 100 on which semiconductor integrated circuit 101 to be tested as shown in FIG. 1 is formed, and manufacturing a semiconductor integrated circuit device which contains semiconductor integrated circuit 101.

When the manufacturing process starts (step S100), semiconductor integrated circuit 101, TEG circuit 103, and the like are formed on substrate 100 by a well-known wafer process (step S102). The wafer process includes: formation of a gate oxide film; formation of an element isolation structure such as an isolation oxide film; ion implantation and diffusion for forming a transistor and the like; film formation for sequentially forming a transistor gate electrode layer, a polysilicon interconnection layer, an interlayer insulation film layer, an aluminum interconnection layer and the like; photolithography for forming a mask to carry out ion implantation only in a selected region or a mask to form a film prepared by the film formation step to a desirable shape; etching of a resist pattern prepared by the photolithography in a mask; in-line testing for checking the process by using the TEG circuit which is formed to monitor the process state; and so on.

After completion of the wafer process, an on-wafer test is performed in which each chip (each semiconductor integrated circuit 101) in a wafer state undergoes a function test to select good ones (step S104). In the on-wafer test, built-in test circuit 102 formed in TEG circuit 103 performs the function test of each semiconductor integrated circuit 101. In the on-wafer test, a chip which is determined to be defective is marked such as by an ink.

In the next assembly process, the substrate is ground to be thinner, and chips formed on substrate 100 are divided by cutting dicing line region 150 using a dicer. At this time, interconnection 104 is also cut by the dicer. Each chip is further assembled and packaged. Thus, a semiconductor integrated circuit is manufactured (step S106).

After the final test process (step S108) after completion of assembly, the semiconductor integrated circuit device is shipped (step S110).

Second Embodiment

Figure 3:
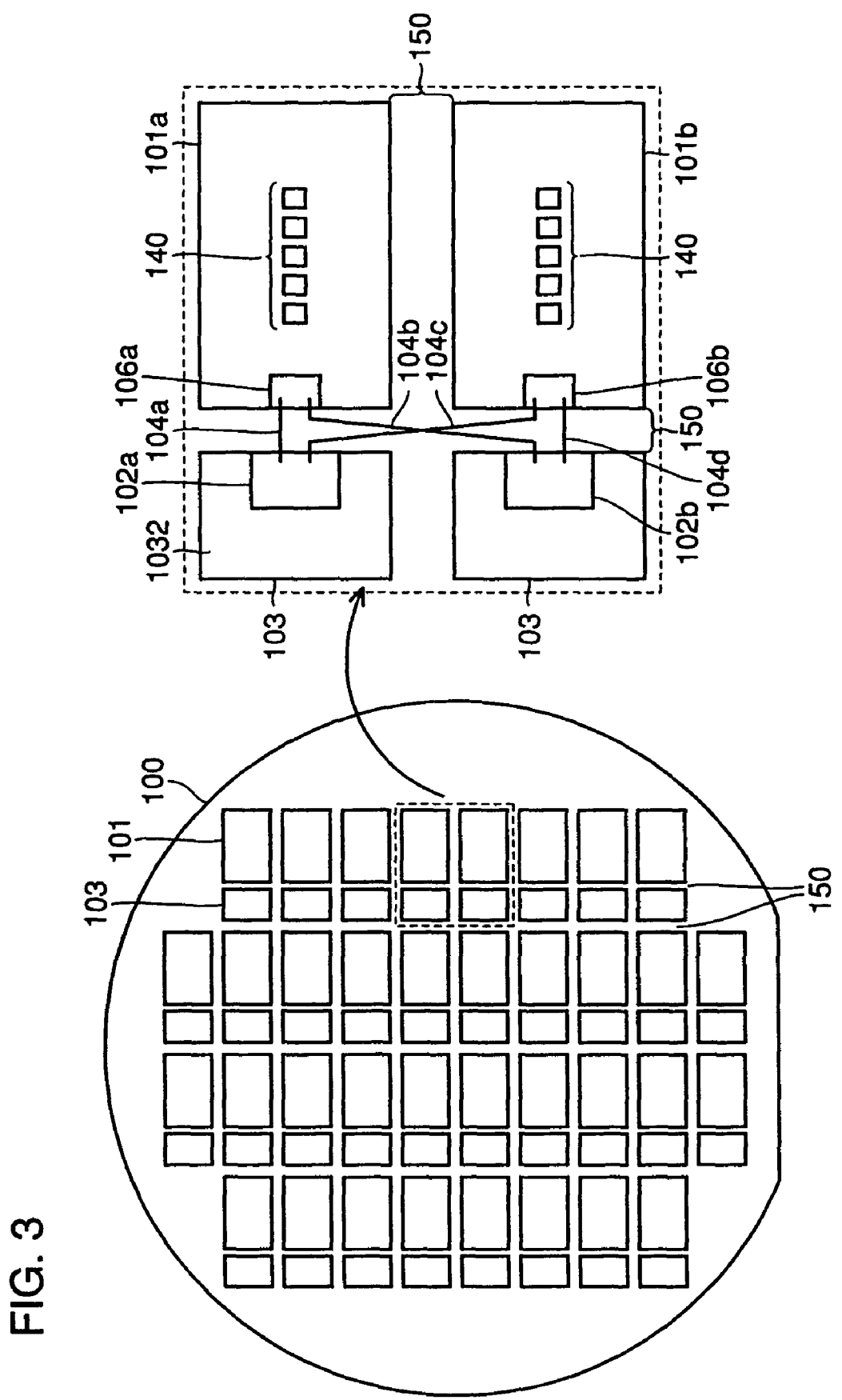
FIG. 3 is a schematic block diagram showing a structure of a semiconductor substrate 100 for forming a semiconductor integrated circuit 101 in a second embodiment of the present invention.

FIG. 3 is a schematic block diagram showing a structure of semiconductor substrate 100 for forming semiconductor integrated circuit 101 in a second embodiment of the present invention.

Comparison with the first embodiment shown in FIG. 1 is as described below.

The second embodiment shown in FIG. 3 is similar to the first embodiment in that built-in test circuits 102 having functions of performing the same test are provided in TEG circuit 103.

In the second embodiment, however, a semiconductor integrated circuit 101a to be tested can be connected to a built-in test circuit 102a in TEG circuit 103, which semiconductor integrated circuit 101a faces across dicing line region 150, by an interconnection 104a, and can be connected to a built-in test circuit 102b in TEG circuit 103, which semiconductor integrated circuit 101a faces across adjacent semiconductor integrated circuit 101b and dicing line region 150, by an interconnection 104b.

Semiconductor integrated circuit 101a connects interconnections 104a and 104b via an input/output circuit 106a which has a selector function. Input/output circuit 106a connects one of interconnections 104a and 104b to semiconductor integrated circuit 101a according to an external designation, for example, a designation which is supplied via pad 140.

Semiconductor integrated circuit 101b to be tested can be connected to built-in test circuit 102b in TEG circuit 103, which semiconductor integrated circuit 101b faces across dicing line region 150, by an interconnection 104d, and can be connected to built-in test circuit 102a in TEG circuit 103, which semiconductor integrated circuit 101b faces across adjacent semiconductor integrated circuit 101a and dicing line region 150, by an interconnection 104c.

Semiconductor integrated circuit 101b connects interconnections 104c and 104d via an input/output circuit 106b which has a selector function. Input/output circuit 106b connects one of interconnections 104c and 104d to semiconductor integrated circuit 101b according to an external designation, for example, a designation which is supplied through pad 140.

In the figure, interconnections 104a to 104d are each a collective body of a plurality of interconnections and represented by one line, similarly to FIG. 1.

According to such a structure, even if one of built-in test circuits 102a and 102b is defective and does not output a normal test result, an on-wafer test can be performed normally by switching the built-in test circuits.

Except for differences in circuit elements formed by the wafer process, a semiconductor integrated circuit device which contains semiconductor integrated circuit 101 in the second embodiment can be formed basically by the manufacturing flow shown in FIG. 2.

However, the on-wafer test process can be performed by switching built-in test circuits 102a and 102b as described above.

Third Embodiment

Figure 4:
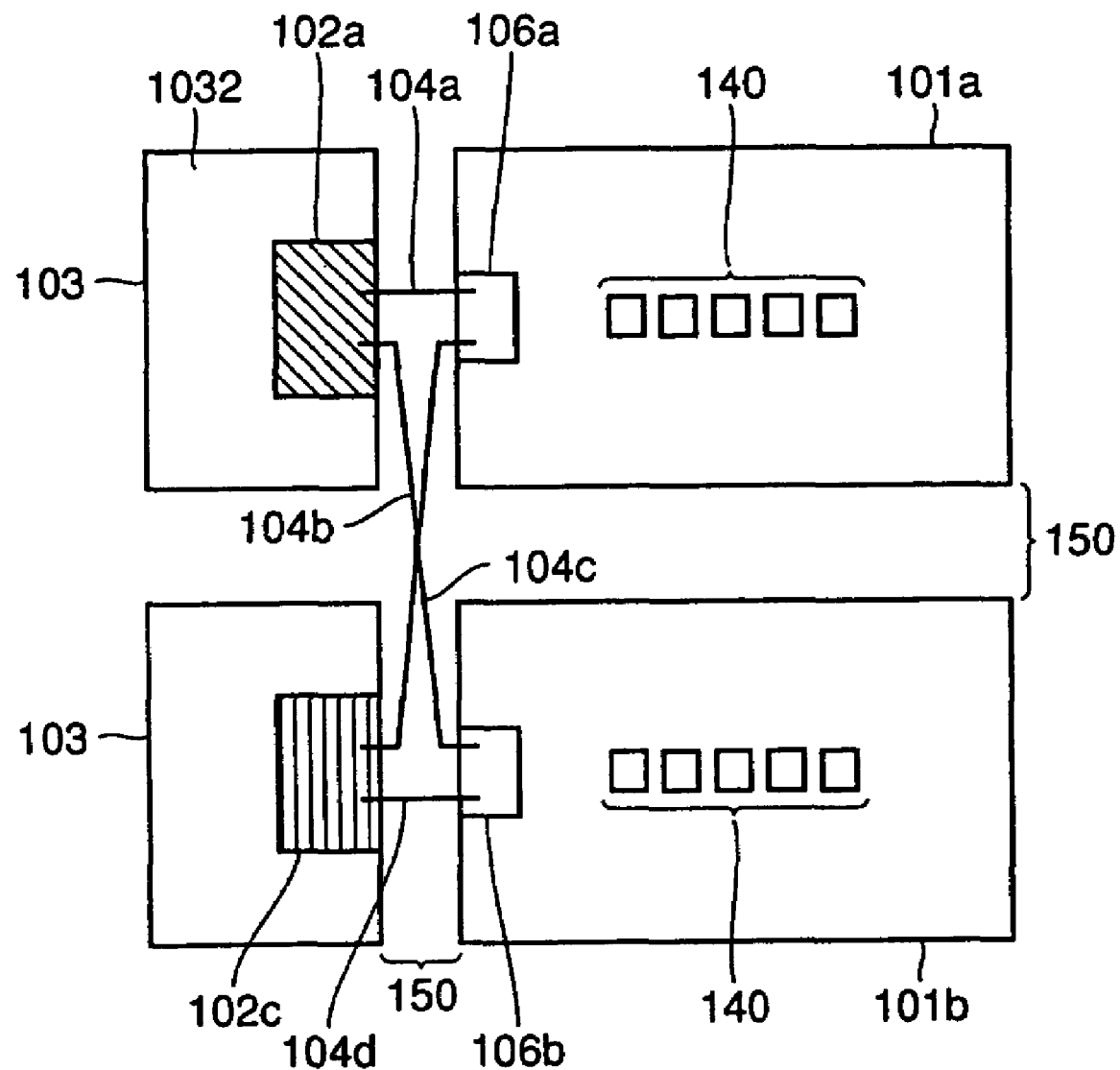
FIGS. 4 to 6 are schematic block diagrams each showing a structure of semiconductor integrated circuits 101a and 101b formed on a semiconductor substrate in third to fifth embodiments of the present invention.

FIG. 4 is a schematic block diagram showing a structure of semiconductor integrated circuits 101a and 101b formed on a semiconductor substrate in a third embodiment of the present invention.

Differently from the structure in the second embodiment shown in FIG. 3, built-in test circuit 102a in TEG circuit 103 which faces semiconductor integrated circuit 101a across dicing line region 150 and a built-in test circuit 102c in TEG circuit 103 which faces semiconductor integrated circuits 101b across dicing line region 150 can perform different tests. By switching to a built-in test circuit which connects to semiconductor integrated circuit 101a or 101b using input/output circuit 106a or 106b, different tests can be performed for each of semiconductor integrated circuits 101a and 101b.

Except for differences in circuit elements formed by the wafer process, a semiconductor integrated circuit device which contains semiconductor integrated circuit 101 in the third embodiment can be formed basically by the manufacturing flow shown in FIG. 2.

However, the on-wafer test process can be performed by switching built-in test circuits 102a and 102b as described above.

Fourth Embodiment

Figure 5:
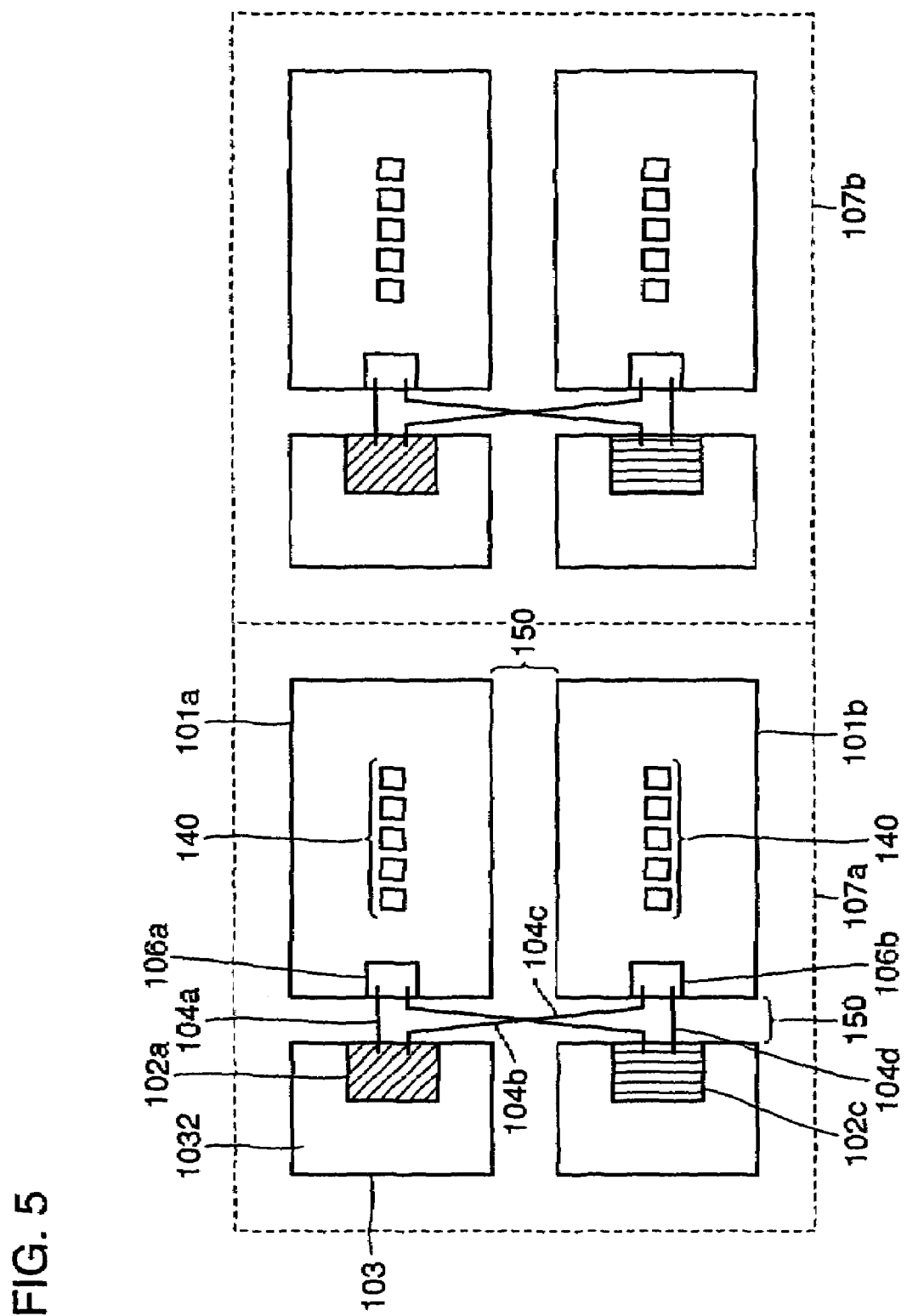

FIG. 5 is a schematic block diagram showing a structure of semiconductor integrated circuits 101a and 101b formed on a semiconductor substrate in a fourth embodiment of the present invention.

In the structure of the third embodiment shown in FIG. 4, semiconductor integrated circuits 101a and 10b as well as TEG circuit 103 are within one reticle size 107a or 107b, as shown in FIG. 5, of a stepper device used in photolithography. In other words, semiconductor integrated circuits 101a and 101b as well as TEG circuit 103 are arranged in a region which is formed by one-shot exposure of the stepper.

In the case shown in FIG. 5, two semiconductor integrated circuits to be tested are provided in one reticle size. More generally, more than two semiconductor integrated circuits may be provided in one reticle size.

By providing any one of the semiconductor integrated circuits in the reticle size and the built-in test circuits in all the TEG circuits in the reticle size so that they can be connected by switching of input/output circuits 106, the maximum items can be tested for one semiconductor integrated circuit.

Fifth Embodiment

Figure 6:
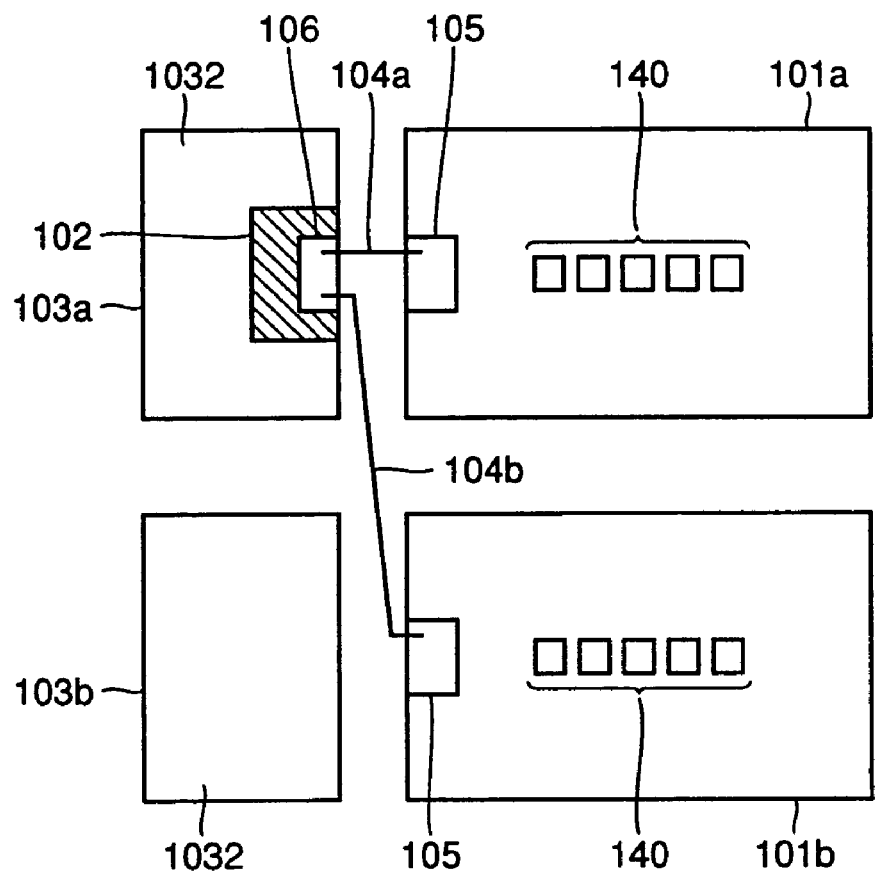

FIG. 6 is a schematic block diagram showing a structure of semiconductor integrated circuits 101a and 101b formed on a semiconductor substrate in a fifth embodiment of the present invention.

In the fifth embodiment, built-in test circuit 102 in TEG circuit 103 which faces semiconductor integrated circuit 101a across dicing line region 150 can be connected to semiconductor integrated circuit 101a by interconnection 104a, and can be connected to semiconductor integrated circuit 101b, which is adjacent to semiconductor integrated circuit 101a, by interconnection 104b. Semiconductor integrated circuit 101a or 101b exchanges data and power supply potentials with interconnection 104a or 104b via input/output circuit 150.

Built-in test circuit 102 connects to interconnections 104a and 104b via input/output circuit 106 which has a selector function. Input/output circuit 106 connects one of interconnections 104a and 104b to built-in test circuit 102 according to an external designation, for example, a designation which is supplied via pad 140.

According to such a structure, it is not necessary to provide built-in test circuit 102 in all the TEG circuits. Thus, test element region 1032 with a sufficient area can be provided in TEG circuit 103.

Except for differences in circuit elements formed by the wafer process, a semiconductor integrated circuit device which contains semiconductor integrated circuit 101 in the fifth embodiment can also be formed basically by the manufacturing flow shown in FIG. 2.

However, the on-wafer test process can be performed by switching semiconductor integrated circuits 101a and 101b for built-in test circuit 102 as described above.

Sixth Embodiment

Figure 7:
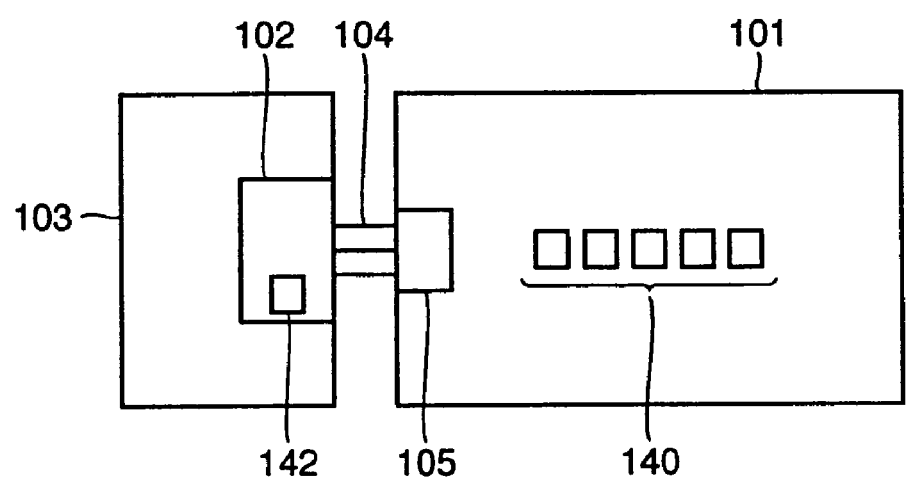
FIGS. 7 to 9 are schematic block diagrams each showing a structure of a semiconductor integrated circuit 101 formed on a semiconductor substrate in fifth to eighth embodiments of the present invention.

FIG. 7 is a schematic block diagram showing a structure of semiconductor integrated circuit 101 formed on a semiconductor substrate in a sixth embodiment of the present invention.

Differently from the structure of the first embodiment shown in FIG. 1, a ground pad 142 for an analog circuit is provided in built-in test circuit 102.

In other words, built-in test circuit 102 includes digital and analog circuits, and an external power supply potential and a ground potential to a digital circuit are supplied, via interconnection 104, from a corresponding one of pads 140 on the side of semiconductor integrated circuit 101.

Meanwhile, an external power supply potential to an analog circuit in built-in test circuit 102 is supplied, via interconnection 104, from a corresponding one of pads 140 on the side of semiconductor integrated circuit 101. A ground potential to an analog circuit in built-in test circuit 102 is supplied via pad 142.

According to such a structure, the ground potential for the analog circuit which is sensitive to noise is supplied via dedicated pad 142, and therefore the resistance of an interconnection which supplies the ground potential can be reduced and noise to the analog circuit in built-in test circuit 102 can be suppressed.

Except for differences in circuit elements formed by the wafer process, a semiconductor integrated circuit device which contains semiconductor integrated circuit 101 in the sixth embodiment can also be formed basically by the manufacturing flow shown in FIG. 2.

Seventh Embodiment

Figure 8:
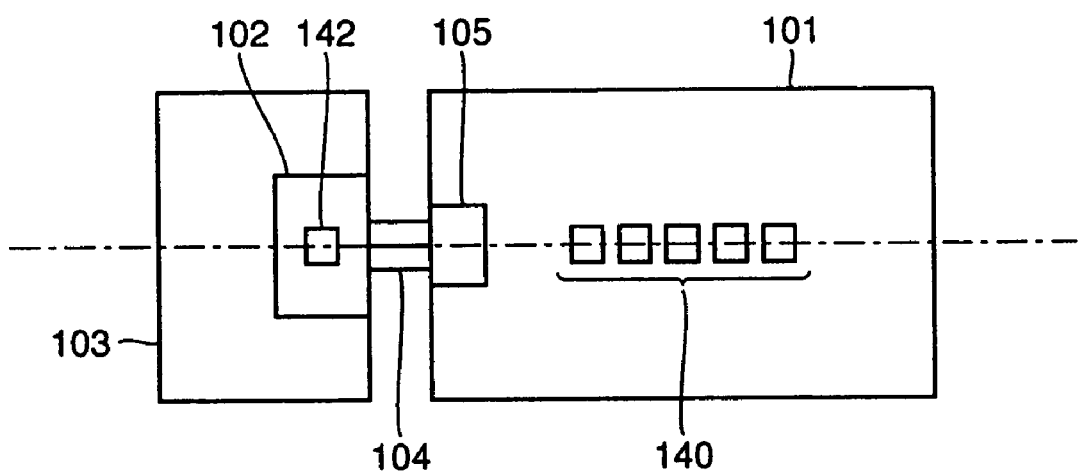

FIG. 8 is a schematic block diagram showing a structure of semiconductor integrated circuit 101 formed on a semiconductor substrate in a seventh embodiment of the present invention.

Differently from the structure of the sixth embodiment shown in FIG. 7, ground pad 142 for an analog circuit provided for built-in test circuit 102 and pads 140 for corresponding semiconductor integrated circuit 101 are aligned and arranged on one center line. Since other parts are similar to FIG. 7, the description will not be repeated.

According to such a structure, it becomes easier to manufacture a probe needle of a probe test tool when performing a test in an on-wafer state, and to stick the needle during testing.

Except for differences in circuit elements formed by the wafer process, a semiconductor integrated circuit device which contains semiconductor integrated circuit 101 in the seventh embodiment can also be formed basically by the manufacturing flow shown in FIG. 2.

Eighth Embodiment

Figure 9:
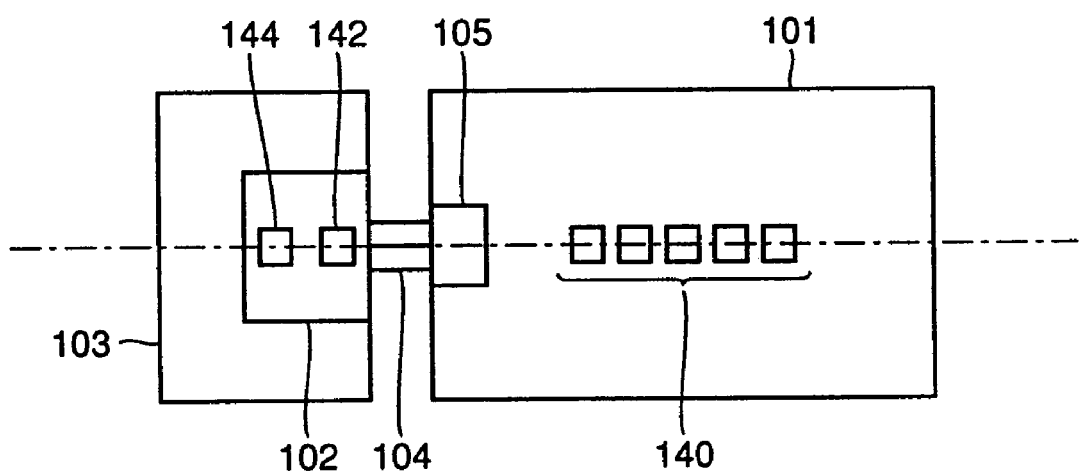

FIG. 9 is a schematic block diagram showing a structure of semiconductor integrated circuit 101 formed on a semiconductor substrate in an eighth embodiment of the present invention.

Differently from the structure of the seventh embodiment shown in FIG. 8, an external power supply pad 144 for an analog circuit is further provided in built-in test circuit 102, and external power supply pad 144 is also aligned on one center line together with analog circuit ground pad 142 and pads 140 for semiconductor integrated circuit 101.

Therefore, a digital circuit of built-in test circuit 102 is supplied, via interconnection 104, with an external power supply potential and a ground potential from a corresponding one of pads 140.

In contrast, an analog circuit of built-in test circuit 102 is supplied with an external power supply potential and a ground potential from pads 142 and 144.

According to such a structure, noise to the analog circuit of built-in test circuit 102 can be further reduced in addition to the effect of the seventh embodiment.

Except for differences in circuit elements formed by the wafer process, a semiconductor integrated circuit device which contains semiconductor integrated circuit 101 in the eighth embodiment can also be formed basically by the manufacturing flow shown in FIG. 2.

Ninth Embodiment

Figure 10:
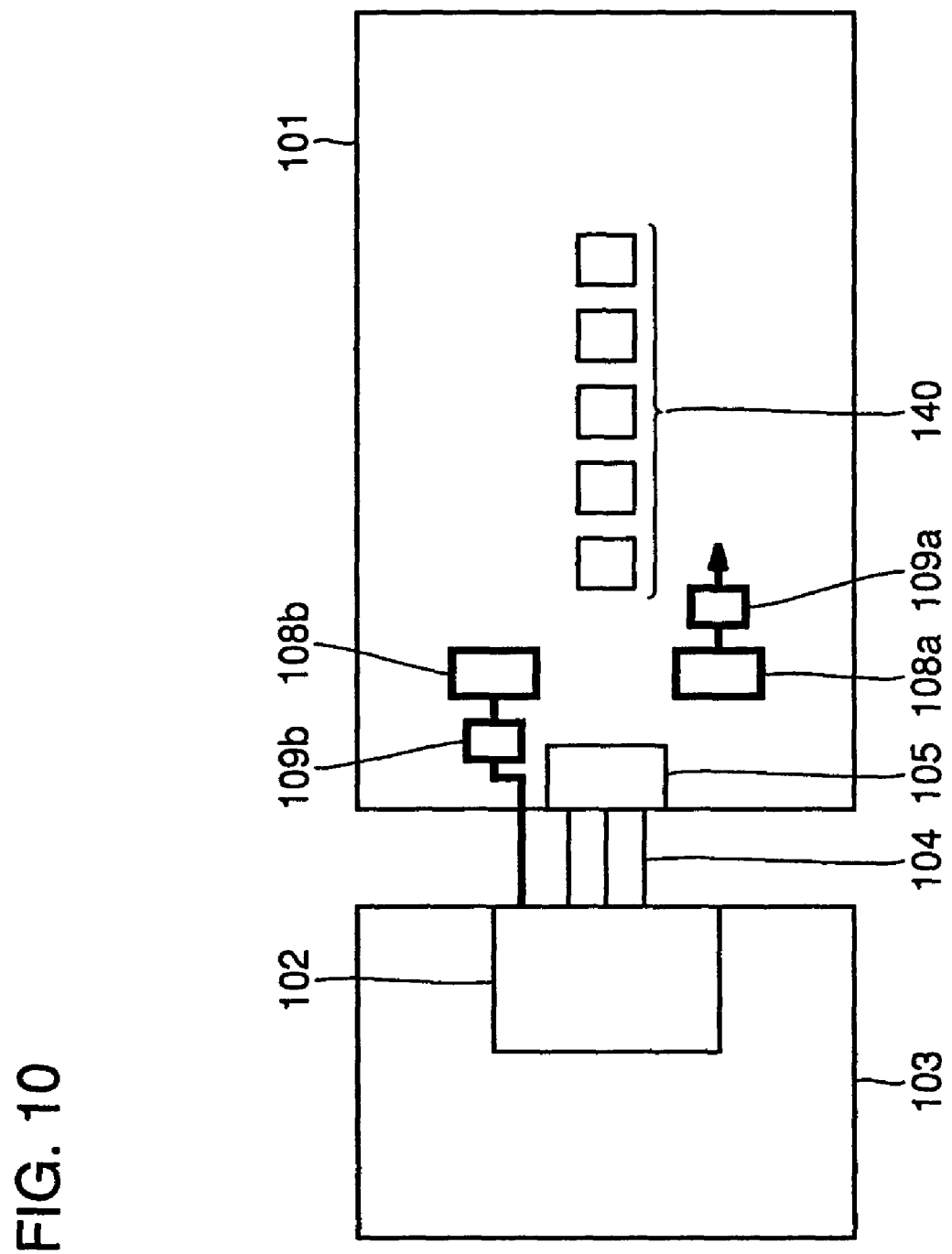
FIGS. 10 to 12 are schematic block diagrams each showing a structure of a semiconductor integrated circuit 101 formed on a semiconductor substrate in ninth to eleventh embodiments of the present invention.

FIG. 10 is a schematic block diagram showing a structure of semiconductor integrated circuit 101 formed on a semiconductor substrate in a ninth embodiment of the present invention.

Differently from the structure of the first embodiment shown in FIG. 1, semiconductor integrated circuit 101 to be tested includes a first internal reference voltage generation circuit 108a for generating an internal potential from an external power supply potential, a buffer circuit 109a for supplying an output of first internal reference voltage generation circuit 108a to the internal circuitry of semiconductor integrated circuit 101, a second internal reference voltage generation circuit 108b for generating an internal potential from an external power supply potential, and a buffer circuit 109b for supplying an output of second internal reference voltage generation circuit 108b to built-in test circuit 102. An output of buffer circuit 109b is supplied to built-in test circuit 102 via interconnection 104.

As described above, internal reference potential generation circuit 108b and buffer circuit 109b are provided not in built-in test circuit 102 but in semiconductor integrated circuit 101, and therefore an internal potential as a reference voltage which requires a high accuracy does not have to be separately provided in the regions of TEG circuit 103 and semiconductor integrated circuit 101. Thus, it becomes easier to design the circuits.

Except for differences in circuit elements formed by the wafer process, a semiconductor integrated circuit device which contains semiconductor integrated circuit 101 in the ninth embodiment can also be formed basically by the manufacturing flow shown in FIG. 2.

Tenth Embodiment

Figure 11:
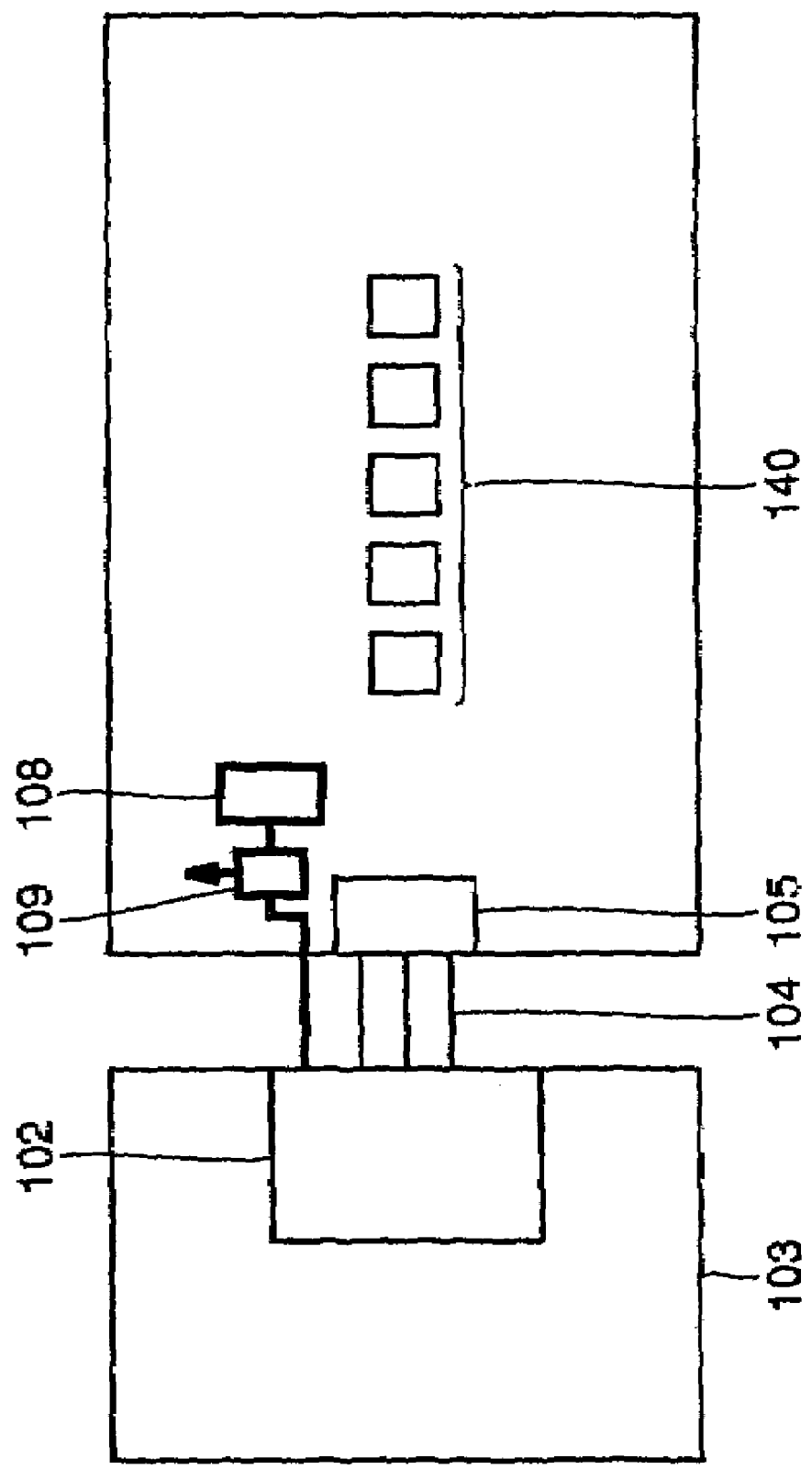

FIG. 11 is a schematic block diagram showing a structure of semiconductor integrated circuit 101 formed on a semiconductor substrate in a tenth embodiment of the present invention.

Differently from the structure of the ninth embodiment shown in FIG. 10, first internal reference voltage generation circuit 108a for supplying an internal potential to semiconductor integrated circuit 101 to be tested and second internal reference voltage generation circuit 108b for supplying an internal potential to built-in test circuit 102 are integrated to form an internal reference potential generation circuit 108, and buffer circuit 109a for supplying the internal potential to semiconductor integrated circuit 101 and buffer circuit 109b for supplying the internal potential to built-in test circuit 102 are integrated to form a buffer circuit 109.

Especially since internal reference potential generation circuit 108 includes a constant current circuit which generally uses a high resistance element and requires a large area, the chip area can be further reduced by causing semiconductor integrated circuit 101 and built-in test circuit 102 to share internal reference potential generation circuit 108.

Except for differences in circuit elements formed by the wafer process, a semiconductor integrated circuit device which contains semiconductor integrated circuit 101 in the tenth embodiment can also be formed basically by the manufacturing flow shown in FIG. 2.

Eleventh Embodiment

Figure 12:
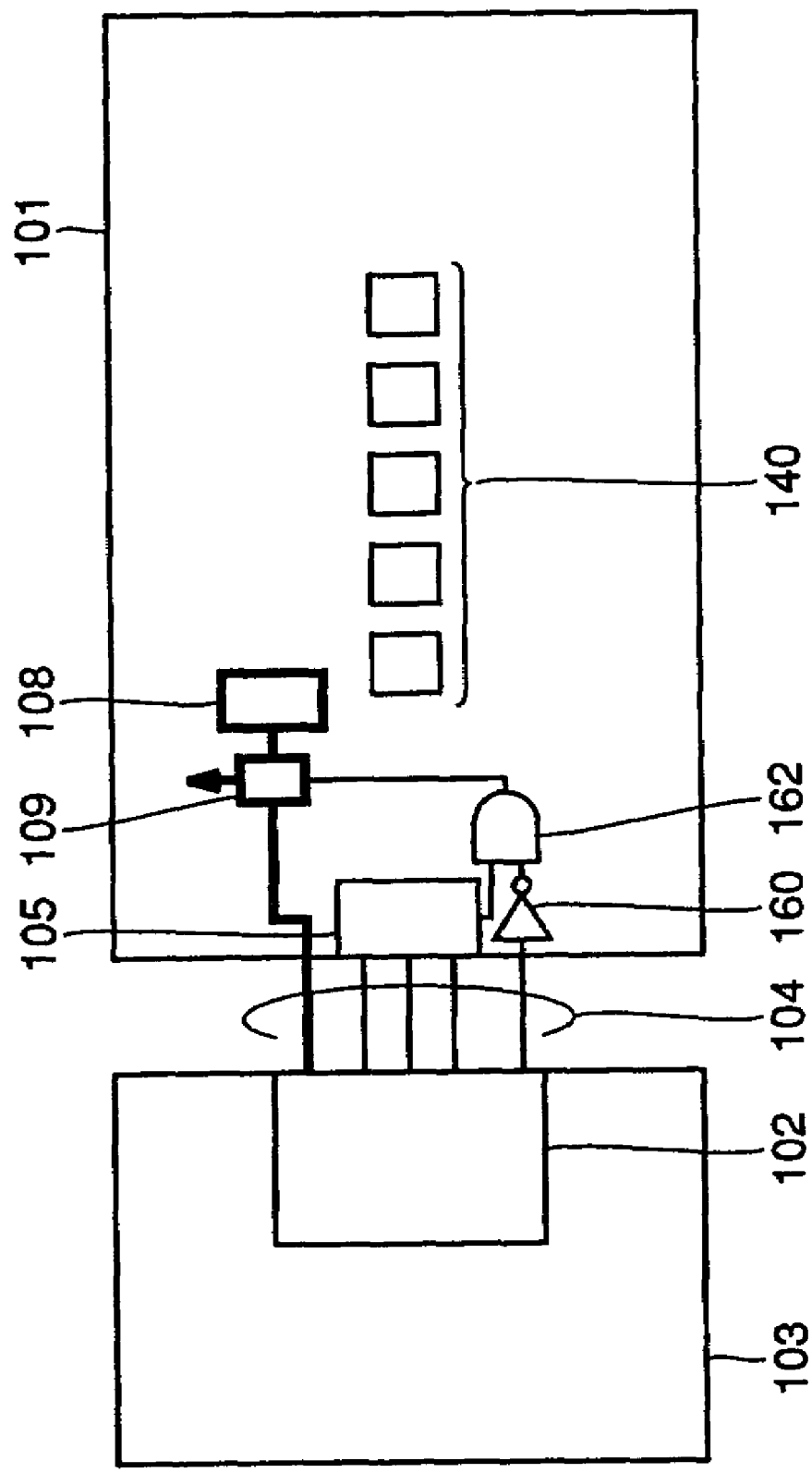

FIG. 12 is a schematic block diagram showing a structure of semiconductor integrated circuit 101 formed on a semiconductor substrate in an eleventh embodiment of the present invention.

Differences from the structure of the tenth embodiment shown in FIG. 11 are as described below.

Built-in test circuit 102 supplies semiconductor integrated circuit 101 with a standby designation signal for designating transition to a standby state and a test enable signal for indicating that built-in test circuit 102 is performing a test, by using interconnection 104.

Semiconductor integrated circuit device 101 further includes an inverter 160 which receives the test enable signal from built-in test circuit 102, and an AND circuit 162 which receives an output of inverter 160 and the standby designation signal from built-in test circuit 102. Buffer circuit 109 assumes the standby state when a signal from AND circuit 160 is active.

According to such a structure, even if a measurement device or built-in test circuit 102 designates transition to the standby state for semiconductor integrated circuit 101, buffer circuit 109 does not assume the standby state while built-in test circuit 102 is performing a test. Therefore, built-in test circuit 102 is supplied with an internal potential from internal reference potential generation circuit 108, and thus the function of semiconductor integrated circuit 101 in a standby operation can be tested by built-in test circuit 102.

Except for differences in circuit elements formed by the wafer process, a semiconductor integrated circuit device which contains semiconductor integrated circuit 101 in the eleventh embodiment can also be formed basically by the manufacturing flow shown in FIG. 2.

Twelfth Embodiment

Figure 13:
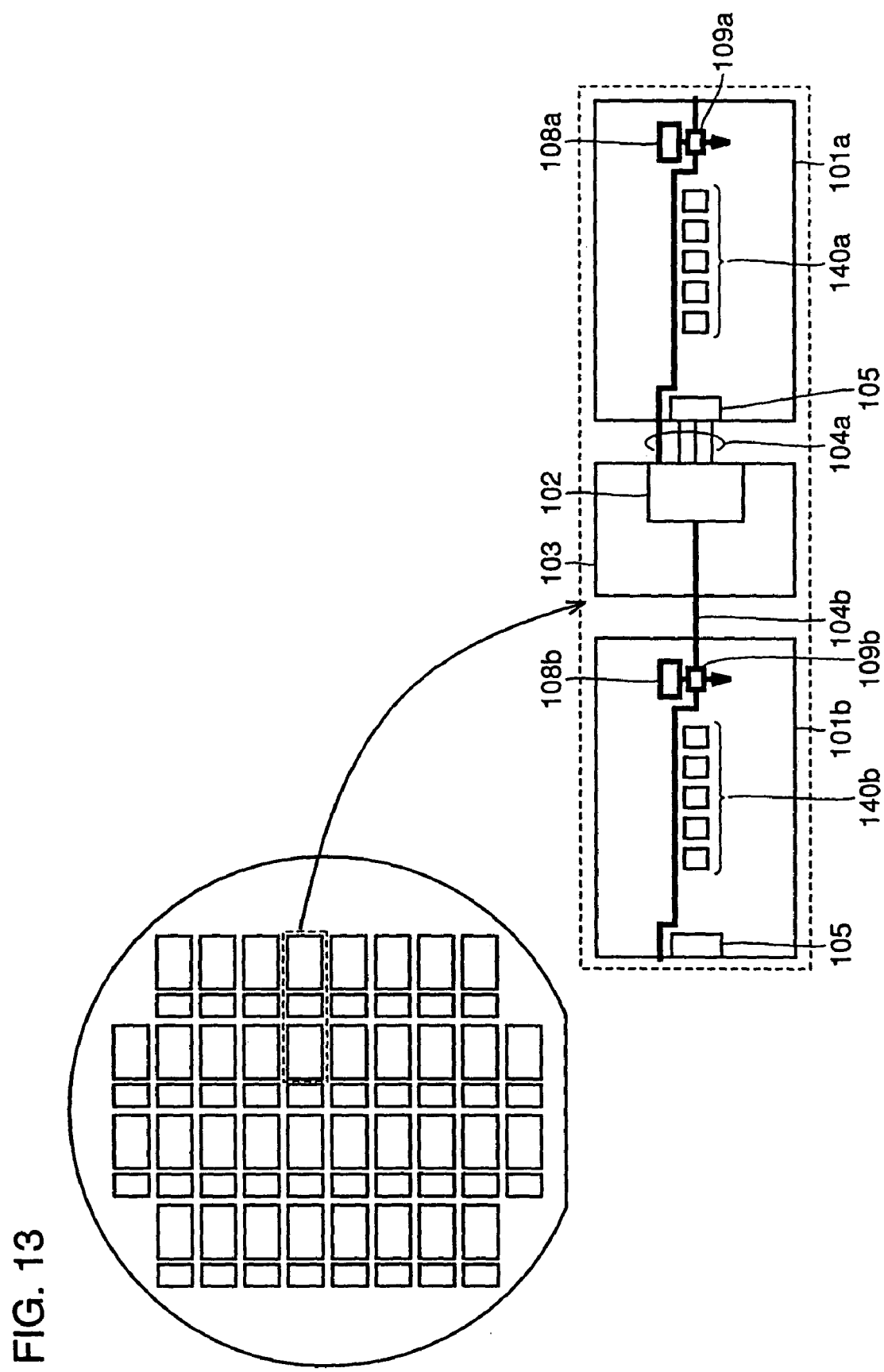
FIG. 13 is a schematic block diagram showing a structure of semiconductor integrated circuits 101a and 101b formed on a semiconductor substrate in a twelfth embodiment of the present invention.

FIG. 13 is a schematic block diagram showing a structure of semiconductor integrated circuits 101a and 101b formed on a semiconductor substrate in a twelfth embodiment of the present invention.

Differently from the structure of the tenth embodiment shown in FIG. 11, built-in test circuit 102 is not supplied with an internal potential from internal reference potential generation circuit 108a and buffer circuit 109a included in semiconductor integrated circuit 101a in a test operation, but is supplied with an internal potential, via interconnection 104b, from internal reference potential generation circuit 108b and buffer circuit 109b included in semiconductor integrated circuit 101b which is not in a test operation.

According to such a structure, built-in test circuit 102 can perform a test while suppressing its influence on the operation of semiconductor integrated circuit 101a to be tested.

As shown in FIG. 13, while semiconductor integrated circuit 101a is tested, built-in test circuit 102 is supplied with an internal potential not always by semiconductor integrated circuit 101b, but the internal potential can be supplied by another semiconductor integrated circuit 101 adjacent to built-in test circuit 102. If necessary, built-in test circuit 102 may be supplied with an internal potential by one of several semiconductor integrated circuits 101 adjacent to built-in test circuit 102 that is selected according to an external designation.

Except for differences in circuit elements formed by the wafer process, a semiconductor integrated circuit device which contains semiconductor integrated circuit 101 in the twelfth embodiment can also be formed basically by the manufacturing flow shown in FIG. 2.

Thirteenth Embodiment

Figure 14:
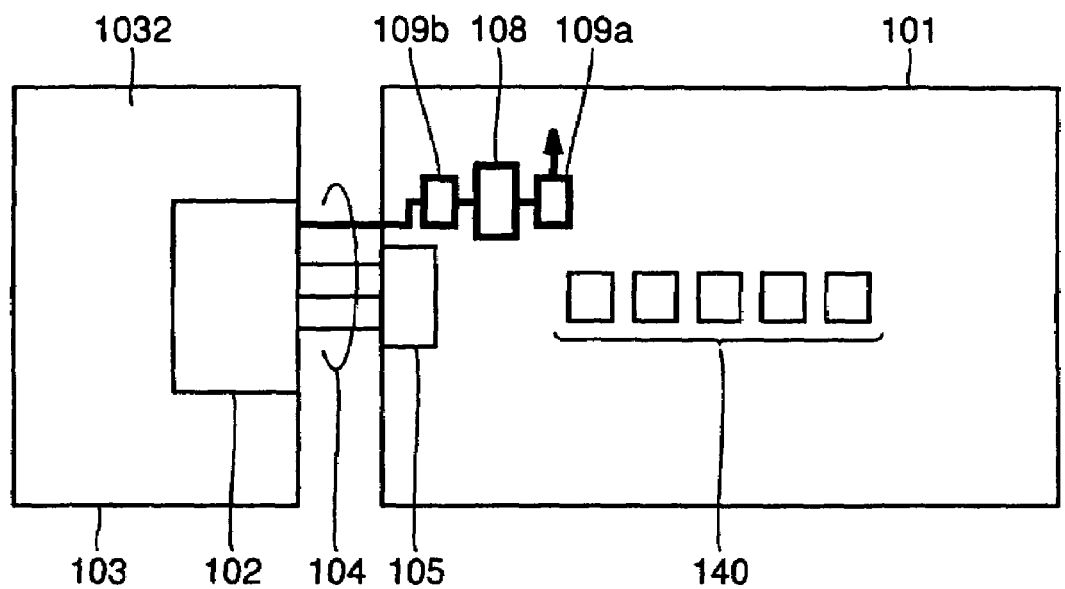
FIGS. 14 and 15 are schematic block diagrams each showing a structure of a semiconductor integrated circuit 101 formed on a semiconductor substrate in thirteenth and fourteenth embodiments of the present invention.

FIG. 14 is a schematic block diagram showing a structure of semiconductor integrated circuit 101 formed on a semiconductor substrate in a thirteenth embodiment of the present invention.

Differently from the structure of the tenth embodiment shown in FIG. 11, buffer circuit 109*a* for supplying an internal potential to the internal circuitry of semiconductor integrated circuit 101 and buffer circuit 109*b* for supplying an internal potential to built-in test circuit 102 are provided for internal reference potential generation circuit 108.

An output from buffer circuit 109*b* is supplied to built-in test circuit 102 via interconnection 104.

As described above, internal reference potential generation circuit 108 includes a constant current circuit which generally uses a high resistance element and requires a large area. Therefore, the chip area can be further reduced by causing semiconductor integrated circuit 101 to be tested and built-in test circuit 102 to share internal reference potential generation circuit 108.

By separately providing buffer circuit 109*a* for the internal circuitry of semiconductor integrated circuit 101 and buffer circuit 109*b* for built-in test circuit 102, mutual interference of the power supply potentials of built-in test circuit 102 and semiconductor integrated circuit 101 can be prevented.

Except for differences in circuit elements formed by the wafer process, a semiconductor integrated circuit device which contains semiconductor integrated circuit 101 in the thirteenth embodiment can also be formed basically by the manufacturing flow shown in FIG. 2.

Fourteenth Embodiment

Figure 15:
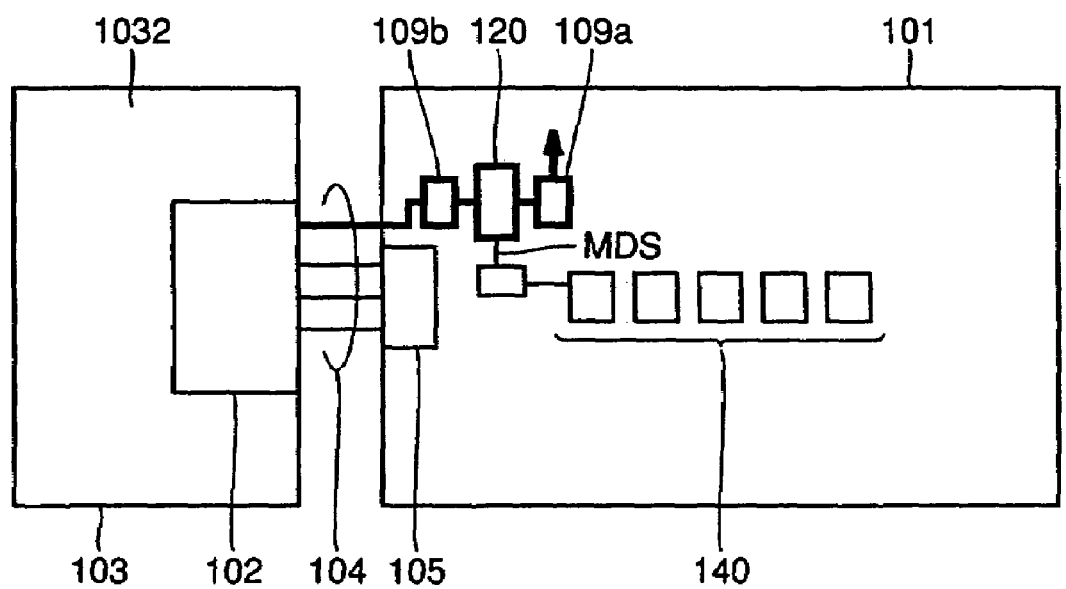

FIG. 15 is a schematic block diagram showing a structure of semiconductor integrated circuit 101 formed on a semiconductor substrate on a fourteenth embodiment of the present invention.

Differences from the structure of the thirteenth embodiment shown in FIG. 14 are as described below.

Semiconductor integrated circuit 101 to be tested includes an operation mode detection circuit for detecting an operation mode which is designated by a signal supplied via pad 140 or by a combination of a plurality of signals supplied via pads 140 and for generating an operation mode signal MDS, and also includes, instead of internal reference potential generation circuit 108, an internal reference potential generation circuit 120 capable of changing the level of an internal potential to be output according to the operation mode.

Since other parts are similar to the thirteenth embodiment shown in FIG. 14, the same parts are designated by the same reference numerals and their description will not be repeated.

Figure 16:
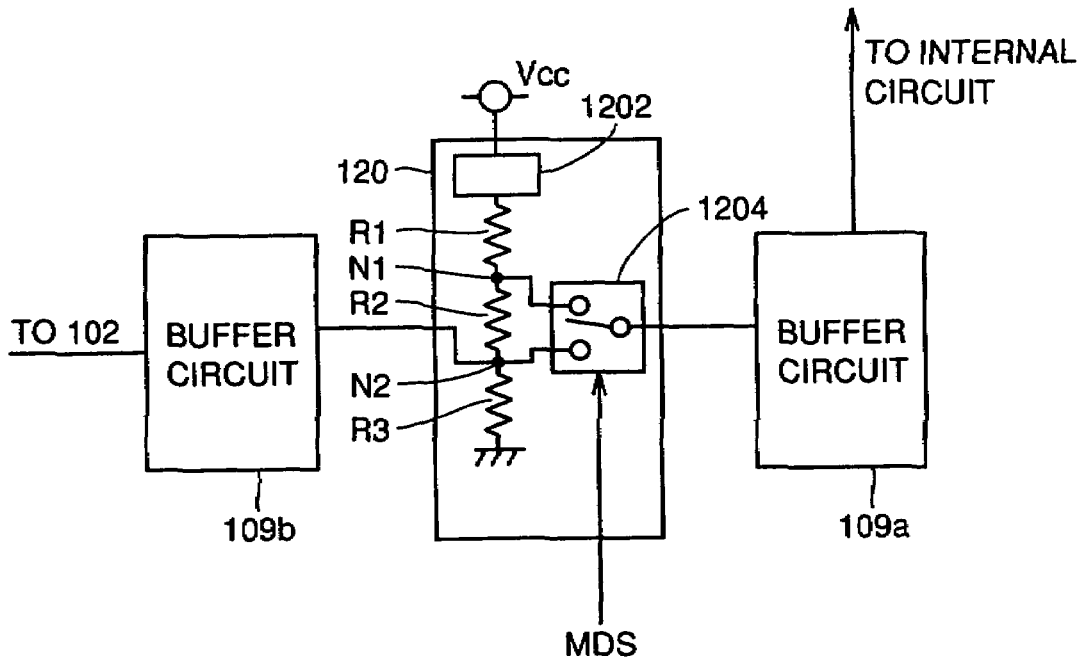
FIG. 16 is a schematic block diagram for illustrating in further detail a structure of an internal reference potential generation circuit 120 shown in FIG. 15.
Figure 17:
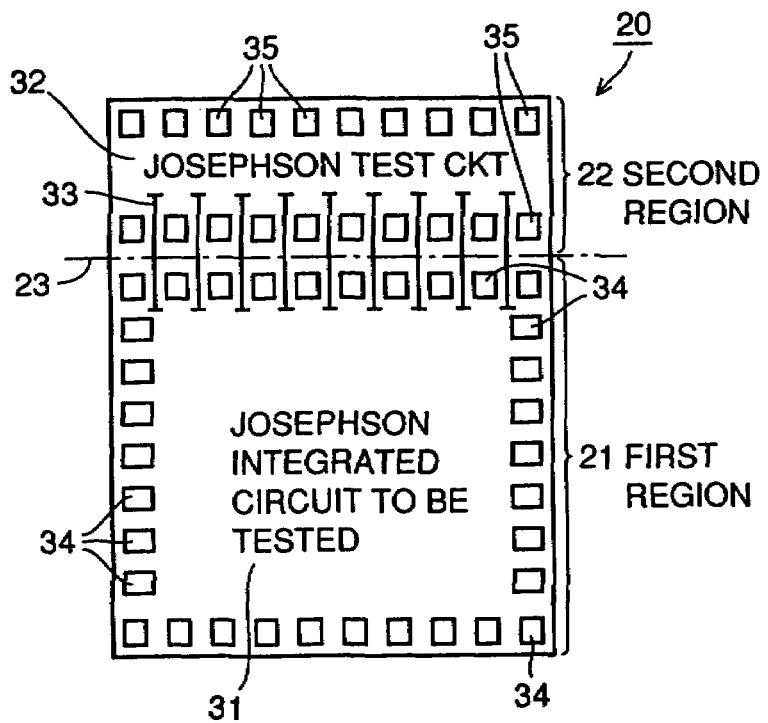
FIG. 17 is a schematic block diagram showing a conventional integrated circuit assembly.

FIG. 16 is a schematic block diagram for illustrating in further detail the structure of internal reference potential generation circuit 120 shown in FIG. 15.

Referring to FIG. 16, internal reference potential generation circuit 120 includes a constant current circuit 1202 which receives an external power supply potential Vcc and supplies a constant current, resistors R1, R2, and R3 which are provided in series between the output of constant current circuit 1202 and the ground, and a switch circuit 1204 which receives a potential at a node N1 for connecting resistors R1 and R2 and a potential at a node N2 for connecting resistors R2 and R3 and switches to a potential to be output according to whether a special operation mode has been designated based on signal MDS.

Since the potential level of connection node N2 is lower than the potential level of connection node N1, buffer circuit 109*b* is supplied with the potential level of connection node N2.

Meanwhile, switch circuit 1204 supplies buffer circuit 109*a* with the potential level of connection node N2 in the normal operation mode, and supplies buffer circuit 109*a* with the potential level of connection node N1 in the special operation mode which corresponds to a stress operation mode where a high voltage is applied to the internal circuitry.

According to such a structure, even when semiconductor integrated circuit 101 is in the special operation mode, the internal potential (reference potential) supplied to built-in test circuit 102 maintains a prescribed value, and therefore built-in test circuit 102 can be operated under constant conditions.

Except for differences in circuit elements formed by the wafer process, a semiconductor integrated circuit device which contains semiconductor integrated circuit 101 in the fourteenth embodiment can also be formed basically by the manufacturing flow shown in FIG. 2.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a semiconductor integrated circuit device, comprising the steps of:
   collectively forming a plurality of semiconductor integrated circuits on a main surface of a substrate;
   forming a plurality of first test circuit formation regions provided correspondingly to said semiconductor integrated circuits, simultaneously with formation of said plurality of semiconductor integrated circuits, while providing an isolation margin region to be able to isolate said plurality of semiconductor integrated circuits and said plurality of first test circuit formation regions from each other,
   said step of forming said first test circuit formation regions including the step of forming a first self operational test circuit in such a region of said first test circuit formation region that faces an adjacent one of said semiconductor integrated circuits across said isolation margin region;
   performing an in-line test for a manufacturing process of said semiconductor integrated circuit by using a plurality of first test elements included in each of said first test circuit formation regions;
   generating and supplying a test signal to a corresponding semiconductor integrated circuit and determining, according to an output signal from said corresponding semiconductor integrated circuit, whether said corresponding semiconductor integrated circuit operates well by using a first self operational test circuit included in each of said first test circuit formation regions; and isolating said plurality of semiconductor integrated circuits into chips by cutting said isolation margin region.

2. The method of manufacturing a semiconductor integrated circuit device according to claim 1, wherein
said first test circuit formation region is provided for each of said semiconductor integrated circuits, and
said step of forming said plurality of first test circuit formation regions includes the steps of
forming a first interconnection provided on said isolation margin region to connect any one of said plurality of semiconductor integrated circuits to said first self operational test circuit provided in a corresponding one of said first test circuit formation regions,
forming a second interconnection provided on said isolation margin region to connect said any one of said semiconductor integrated circuits to said first self operational test circuit provided in said first test circuit formation region corresponding to another semiconductor integrated circuit adjacent to said any one of said semiconductor integrated circuits, and
forming a selector circuit to activate connection to one of said first interconnection and said second interconnection for each of said semiconductor integrated circuits.

3. A method of manufacturing a semiconductor integrated circuit device, comprising the steps of:
collectively forming, on a main surface of a substrate, a plurality of semiconductor integrated circuits which are divided into a first semiconductor integrated circuit group having a plurality of first semiconductor integrated circuits and a second semiconductor integrated circuit group having a plurality of second semiconductor integrated circuits adjacent to said first semiconductor integrated circuits;
forming a plurality of first test circuit formation regions provided correspondingly to said first semiconductor integrated circuits and a plurality of second test circuit formation regions provided correspondingly to said second semiconductor integrated circuits, simultaneously with formation of said plurality of semiconductor integrated circuits, while providing an isolation margin region to be able to isolate said first and second semiconductor integrated circuits and said first and second test circuit formation regions from each other;
forming a first self operational test circuit in such a region of said first test circuit formation region that faces an adjacent one of said first semiconductor integrated circuits across said isolation margin region;
forming a second self operational test circuit in such a region of said second test circuit formation region that faces an adjacent one of said second semiconductor integrated circuits across said isolation margin region;
forming a plurality of first test elements and a first self operational test circuit in said first test circuit formation region and forming a plurality of second test elements and a second self operational test circuit, which performs a test different from that of said first self operational test circuit, in said second test circuit formation region;
forming a first interconnection provided on said isolation margin region to connect any one of the first semiconductor integrated circuits of said first semiconductor integrated circuit group to said first self operational test circuit provided in a corresponding one of said first test circuit formation regions;
forming a second interconnection provided on said isolation margin region to connect said any one of the first semiconductor integrated circuits to said second self operational test circuit provided in said second test circuit formation region corresponding to a second semiconductor integrated circuit adjacent to said any one of the first semiconductor integrated circuits;
forming a third interconnection provided on said isolation margin region to connect any one of the second semiconductor integrated circuits of said second semiconductor integrated circuit group to said second self operational test circuit provided in a corresponding one of said second test circuit formation regions;
forming a fourth interconnection provided on said isolation margin region to connect said any one of the second semiconductor integrated circuits to said first self operational test circuit provided in 3 said first test circuit formation region corresponding to a first semiconductor integrated circuit adjacent to said any one of the second semiconductor integrated circuits;
forming a first selector circuit to activate connection to one of the first interconnection and said second interconnection for each of said first semiconductor integrated circuits;
forming a second selector circuit to activate connection to one of said third interconnection and the fourth interconnection for each of said second semiconductor integrated circuits;
performing an in-line test for a manufacturing process of said semiconductor integrated circuit by using a plurality of first and second test elements included in each of said first and second test circuit formation regions, respectively;
generating and supplying a test signal to a corresponding semiconductor integrated circuit and determining, according to an output signal from said corresponding semiconductor integrated circuit, whether said corresponding semiconductor integrated circuit operates well by using one of said first and second self operational test circuits included in each of said first and second test circuit formation regions which is selected by said first and second selector circuits; and
isolating said plurality of semiconductor integrated circuits into chips by cutting said isolation margin region.

4. The method of manufacturing a semiconductor integrated circuit device according to claim 3, wherein
said first and second semiconductor integrated circuits and said first and second test circuit formation regions are formed in photolithography by a pattern which is formed by one shot of a stepper exposure device.

5. The method of manufacturing a semiconductor integrated circuit device according to claim 1, wherein
said step of forming said semiconductor integrated circuits further includes the steps of
forming a first internal potential generation circuit to generate an internal potential from said external power supply potential,
forming a first buffer circuit to supply said semiconductor integrated circuit with an output of said first internal potential generation circuit,
forming a second internal potential generation circuit to generate said internal potential from said external power supply potential, and
forming a second buffer circuit to supply said first self operational test circuit with an output of said second internal potential generation circuit.

6. The method of manufacturing a semiconductor integrated circuit device according to claim 1, wherein
said step of forming said semiconductor integrated circuits includes the steps of forming an internal potential generation circuit to generate an internal potential from said external power supply potential, and forming a buffer circuit to supply said semiconductor integrated circuit and said first self operational test circuit with an output of said internal potential generation circuit.

7. The method of manufacturing a semiconductor integrated circuit device according to claim 6, wherein said step of forming said first self operational test circuit includes the step of forming a status signal output circuit capable of outputting a test enable signal indicating a test operation state and a standby designation signal to designate transition to a standby state of said semiconductor integrated circuit, and said step of forming said semiconductor integrated circuits further includes the step of forming a gate circuit to disable transmission of said standby designation signal to said buffer circuit when said test enable signal indicates a test state.

8. The method of manufacturing a semiconductor integrated circuit device according to claim 6, wherein said step of forming said first self operational test circuit includes the step of forming means for receiving, while a corresponding semiconductor integrated circuit is tested, said internal potential from a semiconductor integrated circuit other than said corresponding semiconductor integrated circuit of said plurality of semiconductor integrated circuits.

9. The method of manufacturing a semiconductor integrated circuit device according to claim 1, wherein said step of forming said semiconductor integrated circuits includes the steps of forming an internal potential generation circuit to generate an internal potential from said external power supply potential, forming a first buffer circuit to supply said semiconductor integrated circuit with an output of said internal potential generation circuit, and forming a second buffer circuit to supply said first self operational test circuit with an output of said internal potential generation circuit.

10. The method of manufacturing a semiconductor integrated circuit device according to claim 1, wherein said step of forming said semiconductor integrated circuits includes the step of forming an internal potential generation circuit, and said step of forming said internal potential generation circuit includes the steps of forming a first output node, forming a voltage converting circuit to generate, from an external power supply potential, a first internal potential and a second internal potential which is lower than said first internal potential, forming a switching circuit to set a potential to be supplied with said first output node to one of said first and second internal potentials according to an external destination, forming a second output node supplied with said first internal potential, forming a first buffer circuit to supply said semiconductor integrated circuit with a potential from said first output node, and forming a second buffer circuit to supply said first self operational test circuit with a potential from said second output node.

* * * * *